United States Patent
Kroneder

(10) Patent No.: US 8,053,884 B2
(45) Date of Patent: Nov. 8, 2011

(54) POWER SEMICONDUCTOR MODULE WITH SEALING DEVICE FOR SEALING TO A SUBSTRATE CARRIER AND METHOD FOR MANUFACTURING IT

(75) Inventor: Christian Kroneder, Schwanstetten (DE)

(73) Assignee: Semikron Elektronik GmbH & Co. KG, Nuremberg (DE)

( * ) Notice: Subject to any disclaimer, the term of this patent is extended or adjusted under 35 U.S.C. 154(b) by 352 days.

(21) Appl. No.: 12/220,871

(22) Filed: Jul. 28, 2008

(65) Prior Publication Data

US 2009/0039494 A1 Feb. 12, 2009

(30) Foreign Application Priority Data

Jul. 26, 2007 (DE) .......................... 10 2007 034 848

(51) Int. Cl.
*H01L 23/16* (2006.01)
(52) U.S. Cl. ................................. 257/687; 257/E23.136
(58) Field of Classification Search .................. 257/687, 257/E23.136
See application file for complete search history.

(56) References Cited

U.S. PATENT DOCUMENTS

| 4,731,644 A | 3/1988 | Neidig |
| 5,461,774 A | 10/1995 | Holmes et al. |
| 6,233,153 B1 * | 5/2001 | Baur et al. .................... 361/752 |
| 6,624,432 B1 | 9/2003 | Gabower et al. |
| 7,193,852 B2 | 3/2007 | Wetzel |
| 7,275,958 B2 * | 10/2007 | Unruh .......................... 439/587 |

FOREIGN PATENT DOCUMENTS

| DE | 44 39 471 | 5/1996 |
| DE | 101 00 460 | 7/2002 |
| DE | 101 39 287 | 3/2003 |
| DE | 103 40 974 | 3/2005 |
| EP | 0 205 746 | 12/1986 |
| EP | 0 398 108 | 11/1990 |
| EP | 0 447 884 | 9/1991 |

* cited by examiner

*Primary Examiner* — Lex Malsawma

(74) *Attorney, Agent, or Firm* — Roger S. Thompson

(57) ABSTRACT

A power semiconductor module comprising a housing of a first plastic, at least one substrate carrier with a circuit constructed thereon and electric terminating elements extending therefrom. The housing includes attachment means for its permanent connection with the substrate carrier. The housing has a permanently elastic sealing device of a second plastic which is formed integrally with the housing and encircles and is directed towards a first inner main surface of the substrate carrier. A method for constructing such a module includes the steps of constructing a housing of a first mechanically stable plastic and a sealing device of a second permanently elastic plastic; disposing the at least one substrate carrier on the housing; and permanently connecting the housing to the substrate carrier.

7 Claims, 2 Drawing Sheets

POWER SEMICONDUCTOR MODULE WITH SEALING DEVICE FOR SEALING TO A SUBSTRATE CARRIER AND METHOD FOR MANUFACTURING IT

BACKGROUND OF THE INVENTION

1. Field of the Invention

The invention is directed a power semiconductor module and, more particularly, to such a module having a housing, at least one substrate carrier, preferably arranged in a recess of the housing and laterally enclosed by the housing, with a power-electronics circuit arrangement constructed thereon and electrical terminating elements extending therefrom.

2. Description of the Related Art

By way of example, a power semiconductor module generally of the inventive type is disclosed in German Patent No. DE 101 00 460 A1 has long been known in its basic form. Such known power semiconductor modules have a substrate carrier which forms the lower termination of the power semiconductor module. The module includes a housing formed of insulating material and protrudes slightly above the substrate carrier on its longitudinal sides, thereby enclosing it. Such substrate carriers are frequently formed as a flat molded metal body, preferably of copper. This results in low thermal resistance with effective spreading of the heat for dissipating heat from the power-electronics circuit arrangement to a cooling component.

According to the prior art, it is also known that the substrate carrier is bonded to the housing in order to prevent the outflow of a liquid insulating material from the housing, when the housing is filled with such a liquid insulating material, for example a silicone rubber. Furthermore, the housing is connected to the substrate carrier by means of metallic rivet connections. These rivet connections are constructed as hollow bodies with a continuous recess in order to also enable the power semiconductor module to be attached to a cooling component by means of a screw connection. According to the prior art, these rivet connections are preferably made of brass since the lead component of the brass allows for a certain deformation.

On the substrate carrier itself, the circuit arrangement of the power semiconductor module is insulated from the carrier. In this context, various circuit arrangements with power transistors, power diodes and/or power thyristors are known. The circuit arrangement is insulated from the substrate carrier by insulating substrates, for example DCB (direct copper bonding) substrates.

Various terminating elements for load and auxiliary terminals are known, such as control terminals for controlled power semiconductor components. In this context, various technologies for connecting these terminating elements to the substrate or the power semiconductor components of the circuit arrangement are known. For example, solder connections, pressure contact connections and/or sintered pressure connections are particularly preferred.

The disadvantage of known power semiconductor modules is that the substrate carrier is bonded to the housing by an adhesive bond in order to ensure a tightness of the housing to prevent outflow of the silicone rubber during production. The permanently durable bond is additionally achieved by the rivet connection described above.

SUMMARY OF THE INVENTION

The invention is directed to a novel power semiconductor module with a substrate carrier, wherein the carrier is bonded to the housing of the power semiconductor module and wherein the associated production method is both cost-effective and automatable.

The invention is a power semiconductor module with a housing and at least one substrate carrier preferably disposed in a recess of the housing and laterally enclosed by the housing, preferably on all sides. A power-electronics circuit is arranged on the substrate carrier from which electrical terminating elements for load and auxiliary terminals extend. It is preferred if at least one connecting element is a spring contact device. Furthermore, the housing has means for permanently connecting it to the substrate carrier. The substrate carrier thus forms an outside surface of the housing facing the cooling component, or part of an exterior surface of the power semiconductor module.

According to the invention, the housing, preferably the recess of the housing, has a sealing device formed integrally therewith. This sealing device is preferably arranged in the recess of the housing and encircles a first inner main surface of the substrate carrier. According to the invention, the sealing device is preferably formed of a second permanently elastic plastic.

The inventive method for producing such a power semiconductor module includes the following steps:
- constructing a housing, preferably with at least one recess for an associated substrate carrier, in a two-component injection method of a first mechanically stable plastic for the housing with a sealing device of a second permanently elastic plastic;
- arranging the at least one substrate carrier in the housing, preferably in the associated recess of the housing; and
- Permanently connecting the housing and the substrate carrier by an attachment means.

The connection established by the attachment means preferably includes projections on the housing which extend through recesses in the substrate carrier. A rivet connection is formed by exposing the ends of these projections to heat and/or ultrasound, thereby deforming them. In this context, it is preferred if the sealing device at least partially encloses the attachment means of the substrate carrier and directs them towards the recess. A tight construction of this rivet connection to the extent that it may prevent outflow when the power semiconductor module is filled with a silicone rubber, is thus unnecessary.

It can also be particularly preferred if the substrate carrier is replaced in its functionality by the substrate itself. In this context, the substrate forms the boundary of the power semiconductor module and, in turn, has the necessary recesses for the rivet connection.

Particularly preferred developments of this semiconductor component are mentioned in the respective description of the illustrative embodiment. The inventive solution is also explained in greater detail with reference to the illustrative embodiments and FIGS. 1 to 4.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
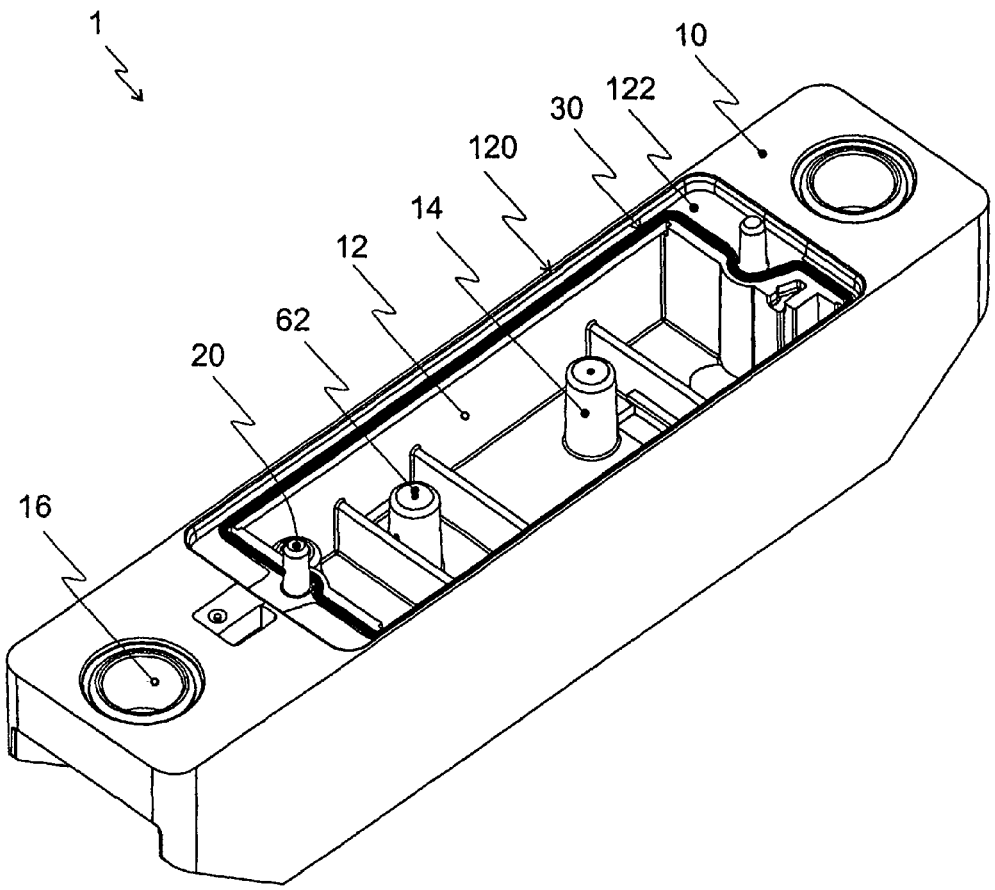
FIG. 1 is a perspective view of a housing without a substrate carrier of a power semiconductor module according to the invention.

FIG. 1 shows, generally at 1, a power semiconductor module in accordance with the invention. Module 1 includes a housing 10, preferably of a plastic which is temperature-stable up to about 150° C., and without a substrate carrier (40 in FIG. 4). Housing 10 has on the side facing a cooling device, (not shown), a recess 12 for receiving a substrate carrier, and two holes 16 for screw connections with the cooling component. Recess 12 advantageously has a web 120 on each of the two longitudinal sides of power semiconductor module 1 to enclose the arrangeable substrate carrier on all sides.

Further holes 14 for arranging connecting elements, in this case auxiliary power semiconductor module 1, connecting elements constructed as contact springs (not shown), are disposed within. These auxiliary connecting elements are used for the external connection of a circuit which is arranged on a substrate carrier which can be disposed within recess 12.

In the area of recess 12, advantageously in its edge area 122 of its narrow sides, housing 10 includes projections 20 preferably constructed integrally therewith. Projections 20 are constructed to be pin-like in this case and protrude above housing 10 in the direction of the substrate carrier to be disposed thereon.

A sealing device 30 of an elastic plastic which was preferably produced jointly with the housing 10 in a two-component injection method is also shown. Sealing device 30 forms a sealing lip disposed about the edge area of recess 12 which preferably encloses projections 20 in such a manner that projections 20 are outside the sealing area of the sealing lip.

Figure 2:
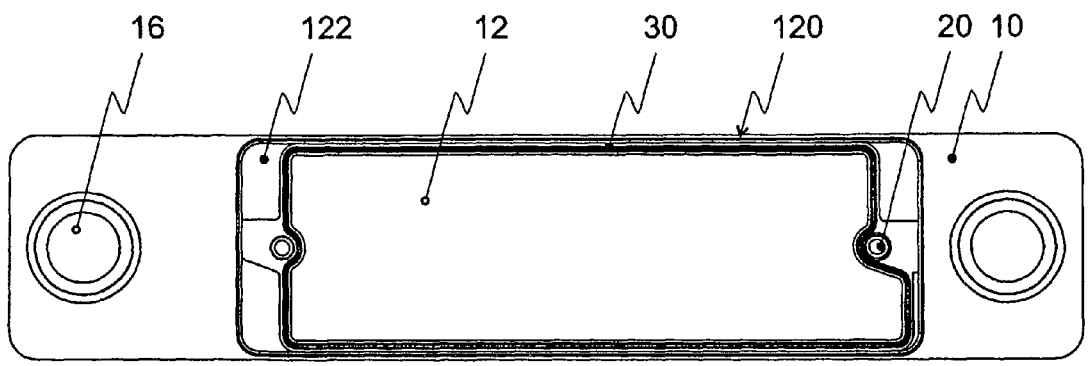
FIG. 2 is a top plan view of the housing of FIG. 1.

FIG. 2 shows a top plan view of housing 10 of power semiconductor module 1, showing recess 12 for the arrangement of the substrate carrier, without details in the interior of the recess. In this case, housing 10 with holes 16 for the screw connection with an arrangeable cooling component is again shown. In the area of recess 12, projections 20 are also shown.

In the interior of recess 12, sealing device 30 according to the invention is disposed. Sealing device 30 is advantageously arranged in such a manner that it leaves open connecting means such as projections 20. Projections 20 are thus located in an area of the recess 12 which is not sealed towards the substrate carrier by sealing device 30. This is advantageous since, as a result, the rivet connection between the projections 20 and the substrate carrier does not have to meet any special requirements for tightness.

However, it may also be preferred to exclusively or additionally arrange connecting means in the area of the surface of the substrate carrier to be sealed, as a result of which the requirements for the rivet connection rise to the extent that it must be constructed to be tight. According to the prior art, it is known to introduce an insulating casting compound into the module during production. When introduced, the compound is a liquid that at least partially fills the module and could thus emerge in the area of the rivet connections.

Figure 3:
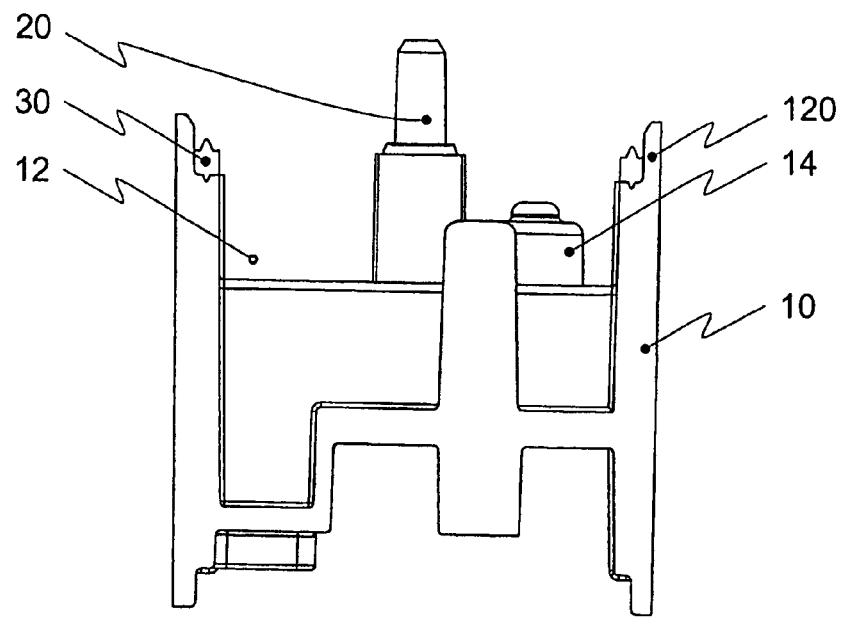
FIG. 3 is a cross-section through the housing of FIG. 1.

FIG. 3 shows a cross section through housing 10. Housing 10 includes recess 20 and, arranged in the area of recess 20, a connecting means for the rivet connection with a substrate carrier in the form of a projection of housing 10 and hole 14 for arranging an auxiliary connecting element constructed, for example, as a contact spring. Recess 12 itself is bounded laterally with respect to the longitudinal sides of power semiconductor module 1 by two webs 120 which form stop means for a substrate carrier to be arranged thereon. Sealing device 30 is arranged directly adjacent to webs 120 in the interior of recess 12. According to the method described, sealing device 30 is constructed of a second permanently elastic plastic and produced of a first plastic, together with housing 10, in a two-component injection.

Figure 4:
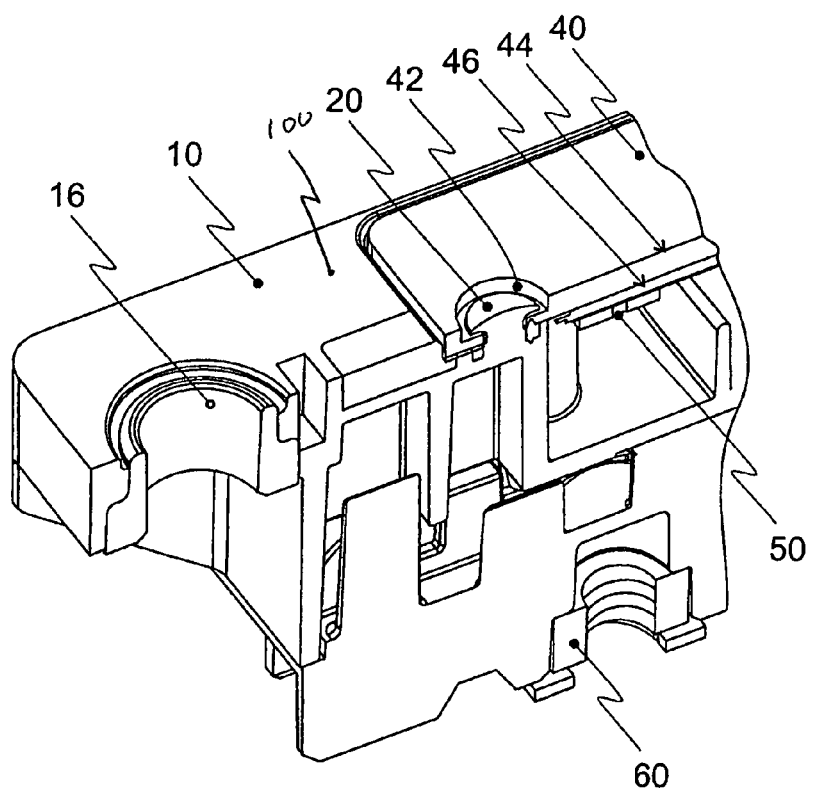
FIG. 4 is a cross-section of a part of the power semiconductor module of FIG. 1 with a substrate carrier arranged thereon.

FIG. 4 shows, in cross section, a part of power semiconductor module 1 according to the invention with a substrate carrier 40 arranged thereon. In this context, substrate carrier 40 is designed as a surface-finished copper plate. Substrate carrier 40 includes recesses 42 which are continuous and flush with projections 20 of housing 10. To achieve a rivet connection of substrate carrier 40 with housing 10, these projections have been deformed by applying heat or ultrasound thereto in such a manner that projection 20 no longer protrudes over an outer main surface 46 of substrate carrier 40.

A power-electronics circuit 50 is arranged on an inner main surface 44 of substrate carrier 40, facing the interior of power semiconductor module 1, and electrically insulated therefrom.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a housing formed of a first plastic;
   at least one substrate carrier for receiving a circuit thereon and having electric terminating elements extending therefrom, said substrate carrier also having a first inner main surface;
   attachment means for permanently attaching said housing to said substrate carrier; and
   a permanently elastic sealing device of a second plastic which is formed integrally in said housing, and encircles and is directed towards said first inner main surface of said substrate carrier;
   wherein said substrate carrier includes recesses therein; and
   wherein said attachment means includes projections on said housing that extend through said recesses in said substrate carrier;
   whereby a rivet connection between said housing and said substrate carrier may be effected by the application of at least one of temperature and ultrasound to the ends of said projections.

2. The power semiconductor module of claim 1, wherein said substrate carrier is formed as a surface-finished copper plate on said first inner main surface of which a power-electronics circuit that is electrically insulated from the copper plate, may be disposed.

3. The power semiconductor module of claim 1, wherein said housing includes a recess, and said substrate carrier is disposed in said recess and is laterally enclosed by said housing and said permanently elastic sealing device is arranged in said recess.

4. The power semiconductor module of claim 1, wherein at least one electronic terminating element is a spring contact device.

5. The power semiconductor module according to claim 1, wherein said substrate carrier includes a recess; and wherein said sealing device at least partially encircles said attachment means and separates said attachment means from said recess.

6. The power semiconductor modules of claim 1, further comprising an electrically insulating casting compound disposed so as to at least partly fill the internal space of the module.

7. The power semiconductor module according to claim 1, wherein the rivet connection is directly between said housing and said substrate carrier, thereby effecting the permanent attachment of said housing to said substrate carrier.

* * * * *